United States Patent
Chen

(10) Patent No.: US 8,082,116 B2
(45) Date of Patent: Dec. 20, 2011

(54) METHOD FOR ESTIMATING LIFE STATUS OF LITHIUM BATTERY

(75) Inventor: Chien-Chen Chen, Taipei County (TW)

(73) Assignee: Inventec Appliances Corp., Taipei (TW)

( * ) Notice: Subject to any disclaimer, the term of this patent is extended or adjusted under 35 U.S.C. 154(b) by 383 days.

(21) Appl. No.: 12/344,975

(22) Filed: Dec. 29, 2008

(65) Prior Publication Data
US 2009/0192737 A1    Jul. 30, 2009

(30) Foreign Application Priority Data
Jan. 30, 2008   (TW) ................................ 97103461 A

(51) Int. Cl.
*G01R 31/36* (2006.01)
(52) U.S. Cl. .............. 702/63; 702/64; 702/66; 320/132; 320/164; 324/423; 324/427
(58) Field of Classification Search ............. 702/63–64, 702/66; 320/132, 164; 324/427, 423
See application file for complete search history.

(56) References Cited

U.S. PATENT DOCUMENTS
5,672,951 A * 9/1997 Shiota ........................... 320/132
* cited by examiner

*Primary Examiner* — Drew A Dunn
*Assistant Examiner* — Hien Vo
(74) *Attorney, Agent, or Firm* — Muncy, Geissler, Olds & Lowe, PLLC

(57) ABSTRACT

A method for estimating a life status of a lithium battery applicable to a portable electronic device is described. The method includes the following steps. Firstly, a plurality of lithium battery life status intervals are sectioned out by a plurality of voltage-electric quantity curves representing characteristics of the lithium battery. Then, an actual voltage and an actual electric quantity of the lithium battery of the portable electronic device are measured. Afterwards, positions of the actual voltage and the actual electric quantity in the lithium battery life status intervals are determined to estimate the life status of the lithium battery.

5 Claims, 3 Drawing Sheets

METHOD FOR ESTIMATING LIFE STATUS OF LITHIUM BATTERY

CROSS-REFERENCE TO RELATED APPLICATION

This application claims the benefit of Taiwan Patent Application No. 097103461, filed on Jan. 30, 2008, which is hereby incorporated by reference for all purposes as if fully set forth herein.

BACKGROUND OF THE INVENTION

1. Field of Invention

The present invention relates to a method for estimating a life status of a lithium battery, and more particularly to a method for estimating a life status of a lithium battery in use by using voltage-electric quantity curves representing characteristics of the lithium battery.

2. Related Art

Nowadays, consumer electronic devices such as mobile phones, PDAs, or notebook computers all use lithium batteries as a power source. Therefore, the lithium battery operational life status and safety influence the overall performance of the electronic devices in a certain degree.

Currently, the life of a lithium battery, calculated in terms of a so-called "charge-discharge cycle", is generally of about 300-500 cycles. Herein, the "charge-discharge cycle" is a cycle since a lithium battery is fully charged and recharged fully after the electric quantity is exhausted. However, a user cannot clearly know which charge-discharge cycle that the lithium battery he/she uses is in. When the lithium battery ages, the electric power provided by the battery becomes less and less, resulting in failures of the electronic devices.

SUMMARY OF THE INVENTION

Accordingly, the present invention directs to a method for estimating a life status of a lithium battery, which is capable of estimating the life status of the lithium battery in use in real time.

In order to solve the above problems, the present invention provides a method for estimating a life status of a lithium battery, which estimates the life status of the lithium battery based on a characteristic that an electric quantity is relatively reduced under a same voltage after the lithium battery is charged and discharged for use for multiple times. Voltage-electric quantity curves corresponding to available charge-discharge cycles of the lithium battery are obtained from an experiment. Afterwards, N−1 voltage-electric quantity curves representing characteristics of the lithium battery, that is, the $(1/N) \times M^{th}$, $(2/N) \times M^{th}$, ..., $((N-1)/N) \times M^{th}$ voltage-electric quantity curves, are obtained, and N lithium battery life status intervals are sectioned out by the N−1 voltage-electric quantity curves. A portable electronic device measures an actual voltage and an actual electric quantity of the lithium battery disposed in the portable electronic device with a time period, and determines one of the N lithium battery life intervals according to the actual voltage and the actual electric quantity, thereby estimating the life status of the lithium battery. Herein, N denotes the number of the lithium battery life status intervals that are sectioned out, which is an integer greater than zero and smaller than or equal to M, and M denotes the number of the available charge-discharge cycles of the lithium battery.

The method for estimating the life status of the lithium battery in the present invention estimates the life of the lithium battery according to the voltage-electric quantity curves in different charge and discharge periods of the lithium battery, so as to remind a user to replace the lithium battery tending to be aged. Thus, the failure of the portable electronic device or damage to an electronic circuit therein is prevented.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

In order to make the present invention become more comprehensible, the present invention is illustrated below in detail through relevant embodiments and accompanying drawings.

Figure 1:
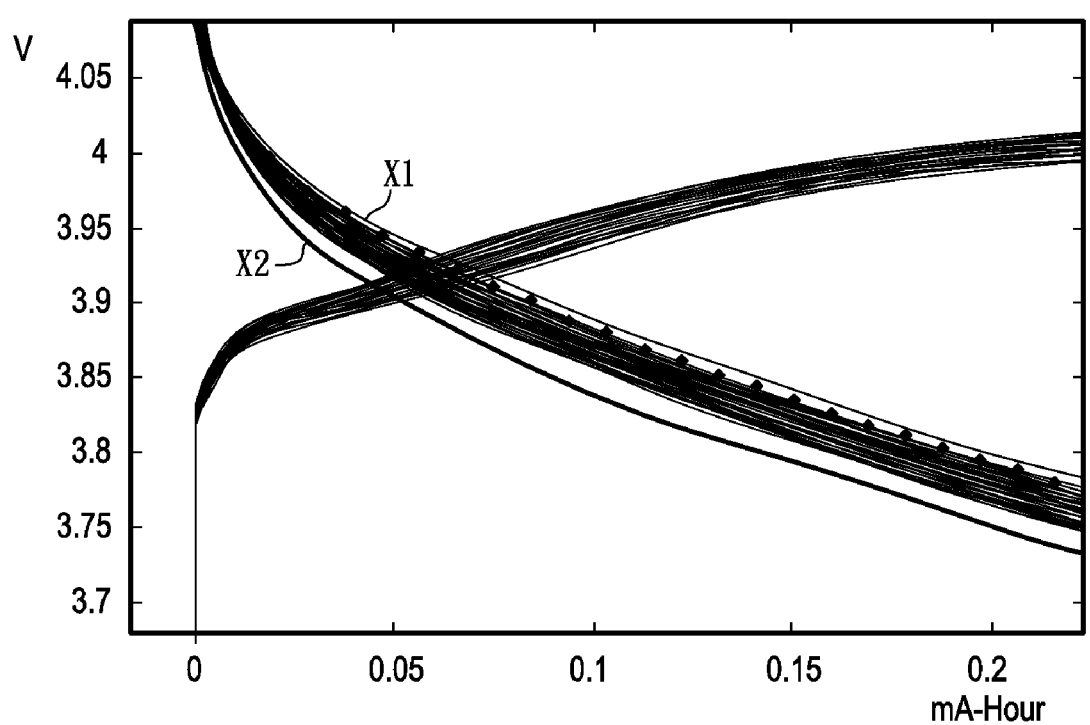
FIG. 1 is a schematic view of voltage-electric quantity curves corresponding to available charge-discharge cycles of a lithium battery in a method for estimating a life status of the lithium battery according to an embodiment of the present invention.

FIG. 1 is a schematic view of voltage-electric quantity curves corresponding to available charge-discharge cycles of a lithium battery in a method for estimating a life status of the lithium battery according to an embodiment of the present invention. Referring to FIG. 1, it is known from a comparison between voltage-electric quantity curves X1 and X2 that, an electric quantity of the lithium battery is gradually reduced under the same voltage after the lithium battery used for multiple times. The present invention estimates the life of the lithium battery based on this characteristic.

Figure 2:
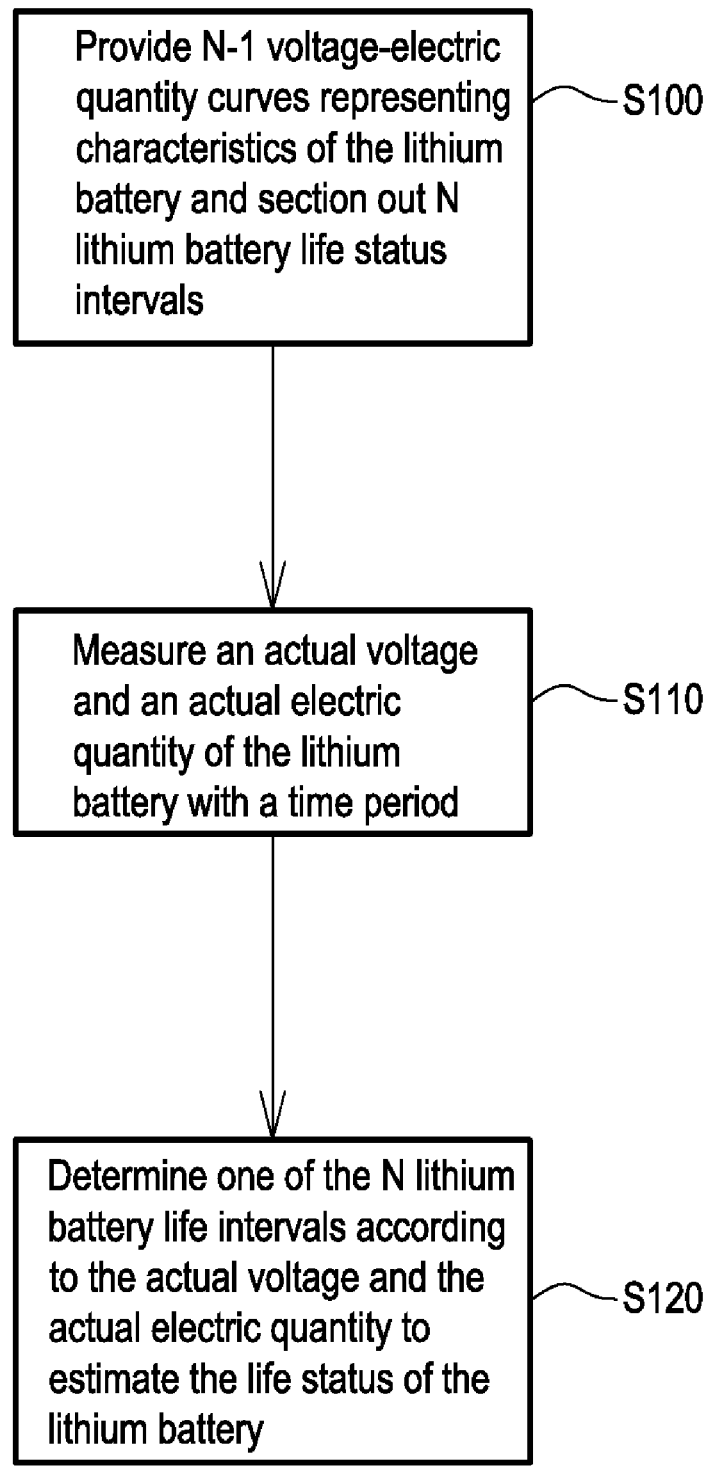
FIG. 2 is a flow chart of the method for estimating the life status of the lithium battery according to an embodiment of the present invention.
Figure 3:
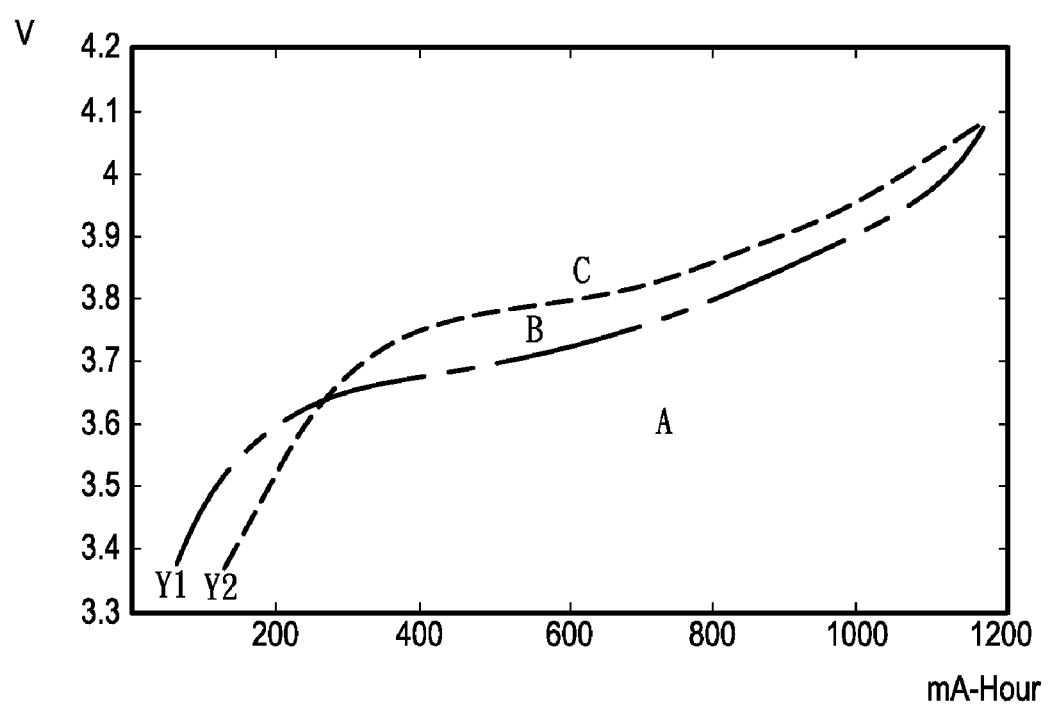
FIG. 3 is a schematic view of voltage-electric quantity curves representing characteristics of the lithium battery and lithium battery life status intervals sectioned out by the voltage-electric quantity curves in the method for estimating the life status of the lithium battery according to the embodiment of the present invention.

FIG. 2 is a flow chart of the method for estimating the life status of the lithium battery according to an embodiment of the present invention, and FIG. 3 is a schematic view of voltage-electric quantity curves representing characteristics of the lithium battery and lithium battery life status intervals sectioned out by the voltage-electric quantity curves in the method for estimating the life status of the lithium battery according to the embodiment of the present invention. Referring to FIGS. 2 and 3 together, the method mainly includes the following steps.

N−1 voltage-electric quantity curves representing characteristics of the lithium battery are provided, and N lithium battery life status intervals are sectioned out (Step S100). Before an portable electronic device goes on the market, the manufacturer first obtains the voltage-electric quantity curves corresponding to the available charge-discharge cycles of FIG. 1 of a lithium battery applied to the device through an experiment, extracts the $(1/N) \times M^{th}$, $(2/N) \times M^{th}$, ..., $((N-1)/N) \times M^{th}$ curves so as to obtain the N−1 voltage-electric quantity curves representing the characteristics of the lithium battery, and sections out N life status intervals of the lithium battery by the obtained N−1 voltage-electric quantity curves. Herein, M denotes the available charge-discharge cycles of the lithium battery.

N denotes the number of the lithium battery life status intervals that are sectioned out. The lithium battery life status may be sectioned into different life status intervals, for example, three life intervals of a new battery status interval, a normal battery status interval, and an aged battery status interval or two life intervals of a new battery status interval and an aged battery status interval upon actual use demands. Herein, N is an integer greater than zero and smaller than or equal to M.

A voltage range of the N−1 voltage-electric quantity curves is from a rated voltage of the lithium battery to a failure voltage of the lithium battery, and an electric quantity range of the N−1 voltage-electric quantity curves is 10% to 100% of the electric quantity of the lithium battery.

For example, if the number of the charge-discharge cycles of a lithium battery is 500 (i.e., M=500) and three lithium battery life status intervals are to be sectioned out (i.e., N=3), the voltage-electric quantity curves representing the characteristics of the lithium battery, i.e., the curves Y1 and Y2 in FIG. 3, may be obtained from the voltage-electric quantity curves corresponding to the 500 charge-discharge cycles of the lithium battery, that is, the $(\frac{1}{3})\times 500^{th}$ and $(\frac{2}{3})\times 500^{th}$ curves. The three lithium battery life status intervals may be sectioned out by the Y1 and Y2 curves to represent different life statuses of the lithium battery, i.e., A, B, and C lithium battery life status intervals in FIG. 3.

With a time period, an actual voltage and an actual electric quantity of the lithium battery are measured (Step S110). For example, the portable electronic device may measure the actual voltage and the actual electric quantity of the lithium battery every 5 seconds or 10 seconds through a control chip.

One of the N lithium battery life intervals is determined according to the actual voltage and the actual electric quantity to estimate the life status of the lithium battery (Step S120). The control chip of the portable electronic device determines one of the N lithium battery life intervals which the measured actual voltage and the actual electric quantity are corresponding to, so as to estimate the life status of the lithium.

In view of the above, the method for estimating the life status of the lithium battery in the present invention estimates the life status of the battery according to the voltage-electric quantity curves in different charge-discharge cycles representing characteristics of the lithium battery, and reminds the user in advance that the lithium battery has reached its service life limit, so as to increase the convenience in use of the battery.

The above descriptions are only illustrative, but not intended to limit the present invention. Various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for estimating a life status of a lithium battery, applicable to a portable electronic device, comprising:
   providing N−1 voltage-electric quantity curves representing characteristics of the lithium battery and sectioning out N lithium battery life status intervals, wherein the N−1 voltage-electric quantity curves are the $[(1/N)\times M]^{th}$, $[(2/N)\times M]^{th}$, ..., $[((N-1)/N)\times M]^{th}$ voltage-electric quantity curves corresponding to available $[(1/N)\times M]^{th}$, $[(2/N)\times M]^{th}$, ..., $[((N-1)/N)-M]^{th}$ charge-discharge cycles of the lithium battery, the N is an integer greater than zero and smaller than or equal to M, and the M is the available number of charge-discharge cycles of the lithium battery;
   a control chip measuring an actual voltage and an actual electric quantity of the lithium battery with a time period; and
   the control chip determining one of the N lithium battery life intervals according to the actual voltage and the actual electric quantity to estimate the life status of the lithium battery.

2. The method for estimating a life status of a lithium battery according to claim 1, wherein the N lithium battery life status intervals are sectioned as a new battery status interval and an aged battery status interval.

3. The method for estimating a life status of a lithium battery according to claim 1, wherein the N lithium battery life status intervals are sectioned as a new battery status interval, a normal battery status interval, and an aged battery status interval.

4. The method for estimating a life status of a lithium battery according to claim 1, wherein a voltage represented on the voltage-electric quantity curves is ranged from a rated voltage to a failure voltage of the lithium battery.

5. The method for estimating a life status of a lithium battery according to claim 1, wherein an electric quantity represented on the voltage-electric quantity curves is ranged from 10% to 100% of the electric quantity of the lithium battery.

* * * * *